(12) United States Patent
Liu (10) Patent No.: US 10,652,502 B2
(45) Date of Patent: May 12, 2020

(54) HOST BOX AND SPLIT-TYPE TELEVISION

(71) Applicants: HKC Corporation Limited, Shenzhen, Guangdong (CN); Chongqing HKC Optoelectronics Technology Co., Ltd., Chongqing (CN)

(72) Inventor: Na Liu, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 0 days.

(21) Appl. No.: 16/278,755

(22) Filed: Feb. 19, 2019

(65) Prior Publication Data

US 2020/0068162 A1    Feb. 27, 2020

Related U.S. Application Data

(63) Continuation of application No. PCT/CN2018/115302, filed on Nov. 14, 2018.

(30) Foreign Application Priority Data

Aug. 27, 2018   (CN) .................... 2018 2 1399358 U (51) Int. Cl.
| | |
|---|---|
| H05K 7/02 | (2006.01) |
| H05K 7/04 | (2006.01) |
| H04N 5/64 | (2006.01) |
| H05K 5/02 | (2006.01) |
| H05K 5/00 | (2006.01) |
| H05K 5/03 | (2006.01) |

(52) U.S. Cl.
CPC ............. *H04N 5/64* (2013.01); *H05K 5/0073* (2013.01); *H05K 5/0247* (2013.01); *H05K 5/03* (2013.01)

(58) Field of Classification Search
USPC ......................................................... 361/807
See application file for complete search history.

(56) References Cited

U.S. PATENT DOCUMENTS

| | | | | |
|---|---|---|---|---|
| 5,199,888 A * | 4/1993 | Condra | ................ | G06F 1/1616 312/292 |
| 6,002,581 A * | 12/1999 | Lindsey | ................ | G06F 1/1616 312/223.2 |
| 6,222,726 B1 * | 4/2001 | Cha | ....................... | G06F 1/1626 361/679.32 |
| 6,288,893 B1 * | 9/2001 | Faranda | .................. | G06F 1/181 312/223.2 |

(Continued)

FOREIGN PATENT DOCUMENTS

| | | |
|---|---|---|
| CN | 102281419 A | 12/2011 |
| CN | 206380028 U | 8/2017 |

(Continued)

*Primary Examiner* — Hung S. Bui (57) ABSTRACT

Disclosed is a host box and a split-type television, wherein the host box includes a box body and a cover plate, a circuit board is mounted within the box body, the circuit board includes an external line interface, and the box body is provided with an aperture corresponding to the external line interface; the cover plate is movably mounted at the aperture, and the cover plate can open the aperture so that the external line is directly connected to the external line interface, or the cover plate can close the aperture.

18 Claims, 6 Drawing Sheets

(56) References Cited

U.S. PATENT DOCUMENTS

| | | | | |
|---|---|---|---|---|
| 6,442,029 | B1 * | 8/2002 | Chang | G11B 33/122 |
| | | | | 248/917 |
| 6,679,710 | B2 * | 1/2004 | Saito | H01R 13/4532 |
| | | | | 312/292 |
| 9,054,444 | B2 * | 6/2015 | Senatori | G06F 1/1633 |
| 2004/0165343 | A1 | 8/2004 | Wu et al. | |

FOREIGN PATENT DOCUMENTS

| | | |
|---|---|---|
| CN | 206471629 U | 9/2017 |
| CN | 207706346 U | 8/2018 |

* cited by examiner

HOST BOX AND SPLIT-TYPE TELEVISION

CROSS-REFERENCE TO RELATED APPLICATIONS

This application is a Continuation Application of PCT application No. PCT/CN2018/115302 filed on Nov. 14, 2018, which claims priority to Chinese patent application No. 201821399358.6 filed on Aug. 27, 2018. All the above are incorporated herein by reference in their entirety.

FIELD OF THE DISCLOSURE

The present application relates to the field of the television technology, and in particular, to a host box and a split-type television to which the host box is applied.

BACKGROUND OF THE DISCLOSURE

Some televisions, such as LCD TVs, can be made into wall-mounted split TVs, which include LCD TV displays and TV host boxes. LCD TV displays only contain some display components (liquid crystal glasses and backlight modules). The TV host box is provided with circuit boards, audio components, etc. The LCD TV display and the TV host box are usually connected by a signal line, and the control effect of the LCD TV display is realized through the host box.

However, the upper cover and the lower casing of the host box need to be separated before the wiring operation can be performed, thereby causing great inconvenience to the connection of the signal line when the circuit board in the TV host box is connected to the signal line connected to the display.

SUMMARY OF THE DISCLOSURE

The present application proposes a host box, which can solve the problem that it is inconvenient for the circuit board in the host box to be connected to the external wiring.

The host box provided by the present disclosure includes a box body and a cover plate, a circuit board is mounted within the box body, the circuit board includes an external line interface, and the box body is provided with an aperture corresponding to the external line interface; the cover plate is movably mounted to the aperture, and the cover plate can open the aperture so that the external line is directly connected to the external line interface, or the cover plate can close the aperture.

Optionally, the inner wall of the aperture is oppositely provided with a pair of connecting posts, and two opposite sides of the cover plate are provided with mounting grooves adapted to the connecting posts, and the connecting posts are inserted into the mounting groove to articulate the cover plate to the box body.

Optionally, the connecting posts are disposed away from a central axis of the aperture; and/or the mounting grooves are disposed away from a central axis of the cover plate.

Optionally, an end of the cover plate interference fits with the aperture away from the connecting posts; and/or the cover plate is provided with a pulling portion to cause the cover plate to open toward the outside of the box body.

Optionally, the pulling portion comprises a bump convexly provided from an end of the cover plate away from the connecting post, the box body has a mating groove cooperating with the bump; the size of the aperture of the mating groove is larger than that of the bump in a direction from the connecting post to the bump.

Optionally, a side of the bump facing the inside of the box body is provided with a wedging block groove, and the wedging block groove runs through the bump away from the end face of the connecting post.

Optionally, the cover plate is provided with a perforating hole in communication with the aperture, and the external line passes through the perforating hole.

Optionally, the perforating hole is disposed at an edge of the cover plate.

Optionally, an end of the cover plate away from the mounting groove is provided with a notch, and the perforating hole includes the notch, and the notch communicates with the aperture.

Optionally, the aperture is disposed at a side wall of the box body and the notch is disposed at a lower end of the cover plate.

Optionally, the shape of the notch is rectangular, or trapezoidal, or curved, or V-shaped, or wavy.

Optionally, the box body has a heat dissipation hole and a horn hole; and/or the box body has an upper cover and a lower casing detachably connected to the upper cover, and a bottom wall of the lower casing is convexly provided with a support post, the support post abuts against the upper cover away from one end of the bottom wall of the lower casing; and/or the aperture is disposed on the lower casing.

Optionally, a plurality of heat dissipation holes are evenly disposed spaced from each other.

Optionally, the upper cover is provided with a buckle toward a side of the lower casing, and the lower casing is correspondingly provided with a buckle hole, and the buckle snaps into the buckle hole to snap fit the upper cover to the lower casing.

The present application further proposes a host box including:

a box body with a circuit board mounted within it, the circuit board includes an external line interface and the box body is provided with an aperture corresponding to the external line interface; and a cover plate movably mounted to the aperture, and the cover plate can open the aperture so that the external line is directly connected to the external line interface; or the cover plate can close the aperture and the outer wall surface of the cover plate is flush with that of the box body.

The present application further proposes a split-type television including a display and the host box described above. The display is connected to the host box by means of being connected to the external line interface through the external line.

The application disposes an aperture at a position corresponding to the external line interface of the box body, and movably mounts a cover plate at the aperture, so that the external line can be easily connected to the external line interface of the box body through the aperture when the user drives the cover plate to open the aperture, and protects components within the box body when the user drives the cover plate to close the aperture. In addition, the cover plate is movably connected to the box body, which is more convenient for the user to drive the cover plate to open or close the aperture, rather than connecting the external line to the external line interface by disassembling the entire box body with the disassembly tool.

BRIEF DESCRIPTION OF THE DRAWINGS

In order to illustrate the technical schemes in the embodiments of the present application or in the prior art more clearly, the drawings which are required to be used in the description of the embodiments or the prior art are briefly described below. It is obvious that the drawings described below are only some embodiments of the present application. It is apparent to those of ordinary skill in the art that other drawings may be obtained based on the structures shown in accompanying drawings without inventive effort.

With reference to the drawings, the implement of the object, features and advantages of the present application will be further illustrated in conjunction with embodiments.

DETAILED DESCRIPTION OF THE EMBODIMENTS

The technical schemes of embodiments of the present disclosure will be clearly and completely described in the following with reference to the accompanying drawings. It is obvious that the embodiments to be described are only a part rather than all of the embodiments of the present disclosure. All other embodiments obtained by persons of ordinary skill in the art based on the embodiments of the present disclosure without creative efforts shall fall within the scope of protection of the present disclosure.

It should be noted that, if there is a directional indication (such as up, down, left, right, front, back, . . . ) in the embodiments of the present application, the directional indication is only used to explain the relative positional relationship, the motion situation, etc. between the components in a certain posture (as shown in the drawings), and if the certain posture changes, the directional indication also changes accordingly.

In addition, if the embodiments of the present application relates to the descriptions of "first", "second" and the like, they are only disposed for the purpose of description only, and are not to be construed as indicating or implying their relative importance or implicitly indicating the number of technical features indicated. Therefore, the characteristics indicated by the "first", the "second" can express or impliedly include at least one of the characteristics. In addition, technical schemes of different embodiments can be combined with each other, however the technical schemes must base on that persons of ordinary skill in the art can realize the technical schemes, when the combination of the technical schemes occurs contradiction or cannot realize, it should consider that the combination of the technical schemes is impractical, and is not contained in the protection scope required by the present disclosure.

The present application proposes a host box 1.

In the embodiment of the present application, as shown in FIG. 1 to FIG. 9, the host box 1 includes a box body 10 and a cover plate 200. The box body 10 is provided with a circuit board 300. The circuit board 300 includes an external line interface 310, and the box body 10 is provided with an aperture 110 corresponding to the external line interface 310; the cover plate 200 is movably mounted to the aperture 110, and the cover plate 200 can open the aperture 110 so that the external line 2 is directly connected to the external line interface 310, or the cover plate 200 can close the aperture 110.

Disposing the aperture 110 at the position corresponding to the external line interface 310 of the box body 10, so that the external line 2 can be directly connected to the external line interface 310 through the aperture 110 when the aperture 110 is in the open state. In addition, by separately providing an aperture 110 for the external line 2 to pass, it is possible to avoid the cumbersome step of disassembling the box body 10 when the external line 2 is connected to the external line interface 310. Further, a cover plate 200 is also movably mounted at the aperture 110, and the cover plate 200 can open the aperture 110 described above or close the opening 110 described above. When the cover plate 200 opens the aperture 110, it is convenient for the penetration of the external line 2 and the connection with the external line interface 310; when the cover plate 200 closes the aperture 110 described above, dust or debris can be prevented from entering the box body 10 of the host box 1 through the aperture 110, ensuring the normal operation of the circuit board components on the circuit board 300 in the box body 10.

It can be understood that the manner in which the cover plate 200 is movably connected to the box body 10 may be a sliding connection or a hinge, etc. Specifically, when the cover plate 200 is slidably connected to the box body 10, the sliding rails may be convexly provided on opposite sides of the aperture 110 of the box body 10. The cover plate 200 is provided with a sliding chute corresponding to the sliding rail, and the sliding rail snaps into the sliding slot in order to achieve the sliding connection effect of the cover plate 200 and the box body 10. Among which the cover plate 200 can slide left and right with respect to the box body 10, and can also slide up and down with respect to the box body 10. Without doubt, opposite sides of the aperture 110 of the casing can also be provided with sliding chutes. The cover plate 200 is provided with a sliding rail corresponding to the sliding chute, and the sliding rail snaps into the sliding chute, so that the cover plate 200 is slidably connected to the box body 10. When the cover plate 200 is hinged with the box body 10, one of the cover plate 200 and the box body 10 is provided with a hinged shaft, and the other is provided with a hinged hole correspondingly. The hinged shaft is inserted into the hinged hole, thereby realizing the hinged effect of the cover plate 200 and the box body 10. For example, when a hinged shaft is disposed on the box body 10 and a hinged hole is correspondingly disposed on the cover plate 200, the hinged shaft may be connected to the inner wall of the opposite sides of the aperture 110, or may be disposed outside the box body 10. By inserting the hinged shaft into the hinged hole, the effect that the cover plate 200 can be rotated about the hinged shaft can be achieved, thereby realizing the effects of opening the aperture 110 and closing the aperture 110. It can be understood that when driving the cover plate 200 to open the aperture 110, in order to prevent the cover plate 200 from hitting the components in the box body 10, the hinged shaft is avoided to be disposed on the inner side of the box body 10 when the cover plate 200 is hinged to the box body 10 in the technical scheme of the present application.

In addition, the shape of the aperture 110 and that of the cover plate 200 are not limited and may be circular, square or other irregular shapes. The shape of the aperture 110 may be the same as or different from that of the cover plate 200, as long as the cover plate 200 can open and cover the aperture 110.

The host box 1 of the present application is provided with an aperture 110 at a position corresponding to the external line interface 310 of the box body 10, and a cover plate 200 is movably mounted at the aperture 110, so that the external line 2 can be easily connected to the external line interface 310 when the user drives the cover plate 200 to open the aperture 110, and protects components within the box body 10 when the user drives the cover plate 200 to close the aperture 110. In addition, the cover plate 200 is movably connected to the box body 10, which is more convenient for the user to drive the cover plate 200 to open or close the aperture 110, rather than opening or closing the aperture 110 by disassembling it by the disassembly tool.

As shown in FIG. 1 to FIG. 7, it is optional that the cover plate 200 and the box body 10 are connected in a hinged manner in this embodiment based on the scheme that the cover plate 200 is movably connected to the box body 10.

Specifically, the inner wall of the aperture 110 is oppositely provided with a pair of connecting posts 111. The opposite sides of the cover plate 200 are provided with mounting grooves 210 adapted to the connecting posts 111. The connecting posts 111 are inserted into the mounting grooves 210 so that the cover plate 200 is hinged with the box body 10. Alternatively, the inner walls of the opposite sides of the aperture 110 are provided with blind holes, and the opposite sides of the cover plate 200 are provided with hinged shafts, and the hinged shafts are inserted into the blind holes to achieve the hinged effect of the cover plate 200 and the box body 10. In the technical scheme of the present application, the connecting post 111 is disposed on the inner wall opposite to the aperture 110, so that when the cover plate 200 is hinged thereto, the outer wall surface of the cover plate 200 is flush with that of the box body 10, so that the cover 200 can be prevented from protruding. From the outer side wall surface of the box body 10, making it easy for the cover plate 200 to open the aperture 110. That is, if the shape and size of the cover plate 200 are both adapted to that of the aperture 110, the cover plate 200 can also function to seal the aperture 110, further preventing debris and dust from entering the inside of the box body 10, affecting the working life of components within the box body 10. Without doubt, in other embodiments, the connecting post 111 may not be disposed on the inner wall of the aperture 110, and may be disposed anywhere on the outer side wall of the box body 10, as long as the cover plate 200 still can open the aperture 110 on the box body 10 after the mounting groove 210 of the cover plate 200 cooperates with the connecting post 111, It can be understood that after the cover plate 200 is hinged with the casing 10, the cover plate 200 can be turned over with respect to the cover plate 10, which can be turned over in a horizontal plane or turned over in a vertical plane, and the direction it turns over depends on the axial direction of the hinged shaft. Therefore, the connecting post 111 or the hinged shaft can be disposed in the horizontal direction or in the vertical direction.

Figure 1:
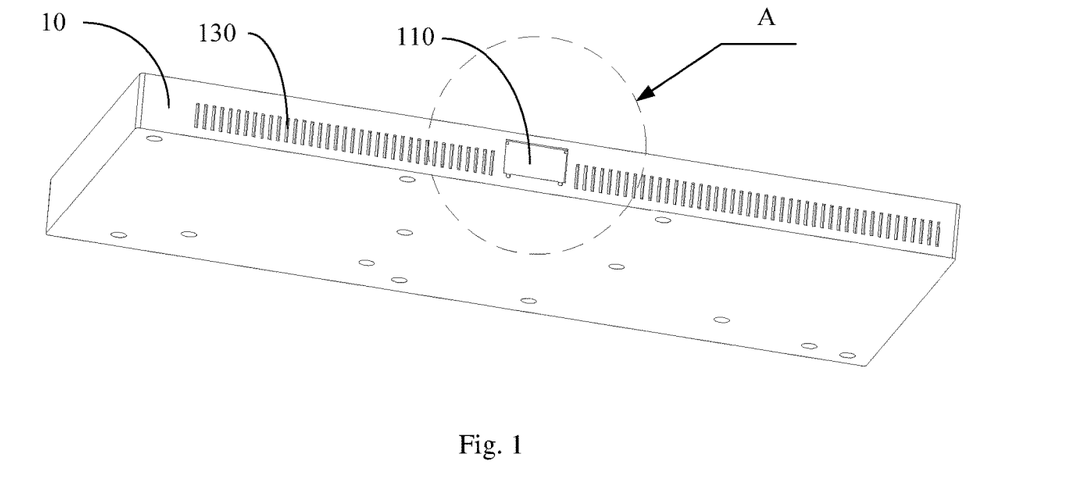
FIG. 1 is a schematic structural view of one view of the box body of the host box of the present application.
Figure 2:
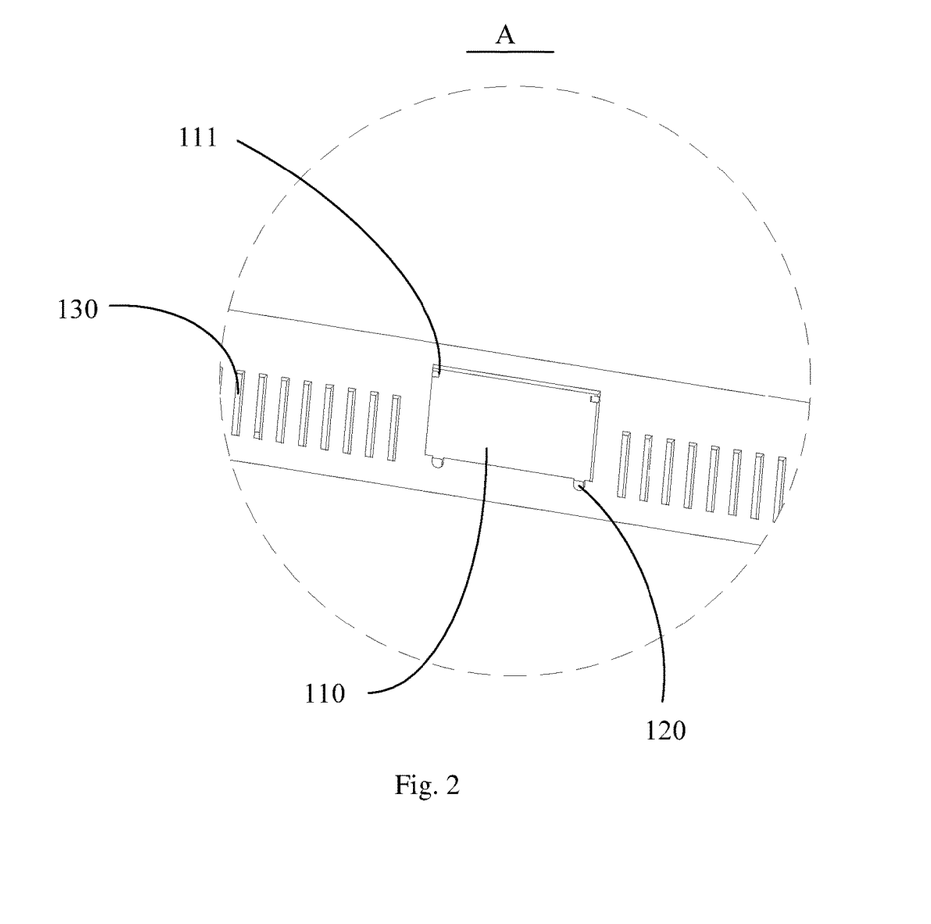
FIG. 2 is an partial enlarged view of A in FIG. 1.

Further, as shown in FIG. 2, in order to facilitate the connection of the external line 2 and the external line interface 310, the connecting post 111 should be disposed in the middle of the aperture 110. Therefore, in the present embodiment, the connecting post 111 can be disposed away from the aperture 110. With this arrangement, the user has a large operation space when the external line 2 is connected to the external line interface 310 through the aperture 110, after the cover plate 200 opening the aperture 110 of the box body 10, thereby facilitating the connection between the external line 2 and the external line 310.

In addition, it can be understood that, in order to enable the cover plate 200 to be utilized to the maximum extent and conform to the aperture 110, the mounting groove 210 can also disposed be away from the central axis of the cover plate 200 based on the premise that the connecting post 111 is disposed away from the central axis of the aperture 110.

Figure 5:
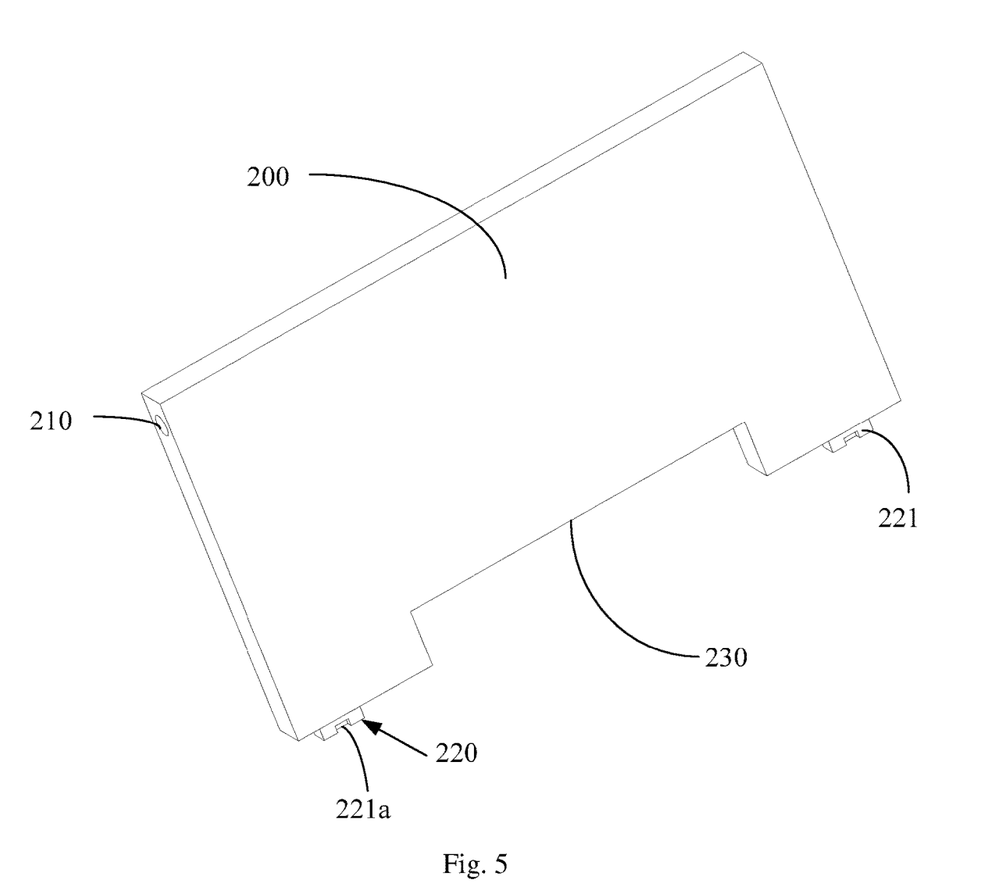
FIG. 5 is a structural view of the cover plate of the host box of the present application.

As shown in FIG. 5, in order to ensure a more stable close effect after the cover plate 200 closes the aperture 110, the end of the cover plate 200 away from the connecting post 111 interference fits with the aperture 110. In this way, the state of closing the aperture 110 can be maintained more stably when subjected to an external force after the aperture 110 is closed by the cover plate 200; the aperture 110 is prevented from being easily closed by the cover plate 200, thereby affecting the working life of components within the box body 10.

It can be understood that the cover 200 can also be provided with a pulling portion 220 in the technical scheme of the present application in consideration of the convenience of pulling the cover plate 200 to open the aperture 110. Specifically, the pulling portion 220 may be a pulling handle disposed on a side of the cover plate 200 away from the inner side of the box body 10, or a pulling groove disposed on the cover plate 200, so that the user can open the cover plate 200 toward the outside of the box body 10 when pulling the pulling portion 220.

Referring to FIG. 1 to FIG. 7, based on the scheme that the above-mentioned cover plate 200 is provided with a pulling portion 220, specifically, in the present embodiment, the pulling portion 220 includes a bump 221 convexly provided at an end of the cover plate 200 away from the connecting post 111. The box body 10 has a mating groove 120 that cooperates with the bump 221; the size of the mating groove 120 is larger than that of the bump 221 in the direction from the connecting post 111 to the bump 221.

By convexly providing the bump 221 at an end of the cover plate 200 away from the connecting post 111, the user can pull the bump 221 in the direction facing away from the inside of the box body 10 and that the bump 221 performs circular motion with the connecting post 111 as an axis, thereby realizing the opening state of the aperture 110 when the user pulls the cover plate 200 to open the aperture 110 on the box body 10. In addition, the box body 10 has a matching groove 120 that cooperates with the bump 221 so that when the cover plate 200 closes the aperture 110, the bump 221 can cooperate with the matching groove 120 to prevent the bump 221 from protruding from the outer wall of the box body 10 and suddenly being lifted after being subjected to external force, so that the cover 200 plate accidentally opens the aperture 110 of the box body 10.

Further, in the direction from the connecting post 111 to the bump 221, the size of the mating groove 120 is larger than that of the bump 221, so as to provide to the user a pulling space when the user pulls the bump 221, so that the user's hands can hold the bump 221 to face away from one side of the connecting post 111 and pulls in the direction facing away from the inside of the box body 10, thereby the effect that the cover plate 200 opens the aperture 110 can be realized by the user pulling the bump 221.

It can be understood that the bump 221 is adapted to the inner diameter of the mating groove 120 in the direction in which the connecting post 111 extends. Further, in this direction, the bump 221 and the mating groove 120 can adopt an interference fit to ensure that the fit of the two is relatively tight, preventing the cover plate 200 from being lifted by an unexpected external force. Without doubt, in other embodiments, in order to achieve the effect of the above-mentioned bump 221 and the mating groove 120 being tightly connected, the bottom wall of the mating groove 120 may be provided with a threaded hole, and the bump 221 is correspondingly provided with a mounting hole, and the screw is inserted through the mounting hole and is in screwed connection with the threaded holes, so that the bump 221 and the mating groove 120 are firmly connected by screws, and the effect of avoiding to lift the cover plate 200 by an unexpected external force can be achieved further.

As shown in FIG. 5, based on the scheme that the cover plate 200 has the above-mentioned bump 221, the bump 221 has a wedging block groove 221a on the inner side of the box body 10, and the wedging block groove 221a extends through the end face of the bump 221 away from the connecting post 111. With this arrangement, the user can hold the bump 221 firmly, and can reverse the hand in the wedging block groove 221a through the mating groove 120. By pulling the cover plate 200 outward, driving the cover plate 200 to perform circular motion with the connecting post 111 as an axis and in the direction facing away the inside of the box body 10, thereby achieving the effect of opening the aperture 110.

Further, in order to prevent the external line 2 from being pressed by the inner wall of the cover plate 200 and the aperture 110 after being connected to the external line interface 310. The cover plate 200 is provided with a perforating hole in communication with the aperture 110, and the external line 2 is inserted through the perforating hole.

Specifically, the cover 200 is opened, and the external line 2 is inserted from the side of the cover plate 200 away from the box body 10 through the perforating hole on the cover plate 200, and is connected to the external line interface 310 on the side of the cover plate 200 facing the box body 10. It can be understood that the perforating hole can be disposed at any position opposite to the aperture 110 of the cover plate 200. For example, the perforating hole can be disposed at the middle or the edge of the cover plate 200, where the position of the perforating hole can be disposed specifically with respect to that of the external line interface 310.

Figure 6:
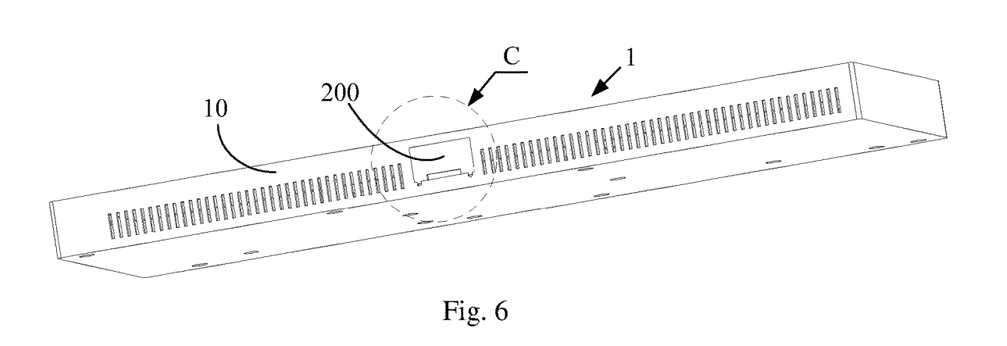
FIG. 6 is a schematic assembly view of the box body and the cover plate of the host box of the present application.
Figure 7:
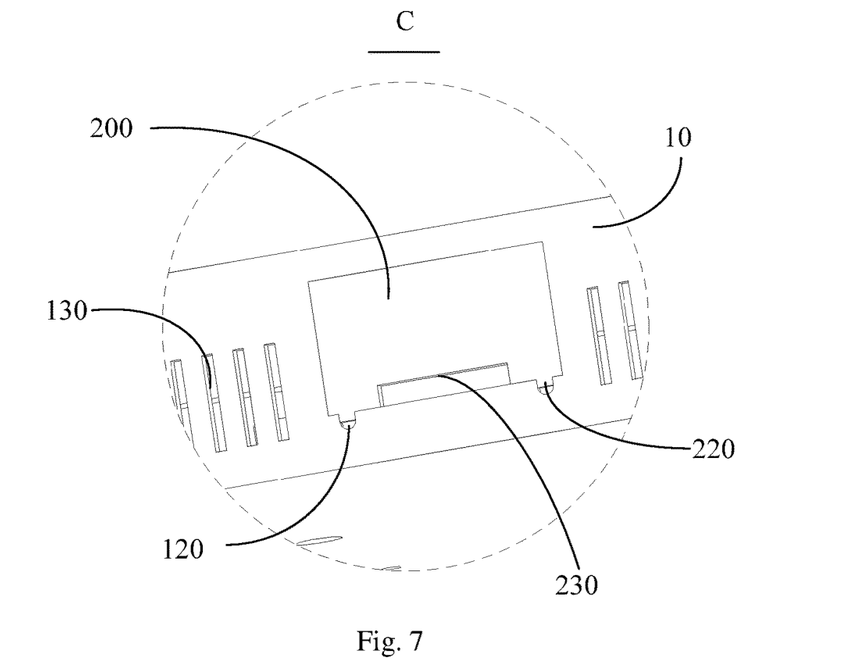
FIG. 7 is an partial enlarged view of C in FIG. 6.

As shown in FIG. 5 to FIG. 7, in the technical scheme of the present application, one end of the cover plate 200 away from the mounting groove 210 is provided with a notch 230, and the perforating hole includes a notch 230, and the notch 230 is in communication with the aperture 110.

The notch 230 is in communication with the aperture 110 by disposing a notch 230 on one end of the cover plate 200 away from the mounting groove 210, so that the external line 2 can be connected to the external line interface 310 inside the box body 10 through the notch 230. Moreover, when the notch 230 is disposed at one end of the cover plate 200 away from the mounting groove 210, the user drives the cover plate 200 to open the aperture 110 or close the aperture 110 without affecting the connection of the external line 2 to the external line interface 310, that is, the opening and closing of the cover plate 200 has no influence on the external line 2, so that it is more convenient for the mounting and disassembly of the external line 2 and the external line 2 is not damaged. Specifically, the shape of the notch 230 may be rectangular, trapezoidal, curved, V-shaped or wavy.

Further, the aperture 110 can be disposed on the sidewall of the box body 10 while the notch 230 is disposed at the lower end of the cover plate 200. With this arrangement, it is difficult for the external line 2 to interfere with the top wall of the notch 230 due to the influence of gravity, so that the external line 2 is not affected by the cover plate 200 when the cover plate 200 opens or closes the aperture 110 when hinged with the box body 10, reducing the chance of damages to the external line 2.

As shown in FIG. 1, 2, 3, 7, or 9, since the circuit board 300 is mounted in the box body 10, some components on the circuit board 300 generate heat during operation, the box body 10 has a heat dissipation hole 130 in the present embodiment in order to ensure that these components can work at a constant ambient temperature. The heat dissipation hole 130 are provided to disperse heat generated during operation of the components in the box body 10 to extend the working life of components inside the box body 10. Optionally, a plurality of heat dissipation holes 130 can be evenly disposed spaced from each other in the box body.

Figure 3:
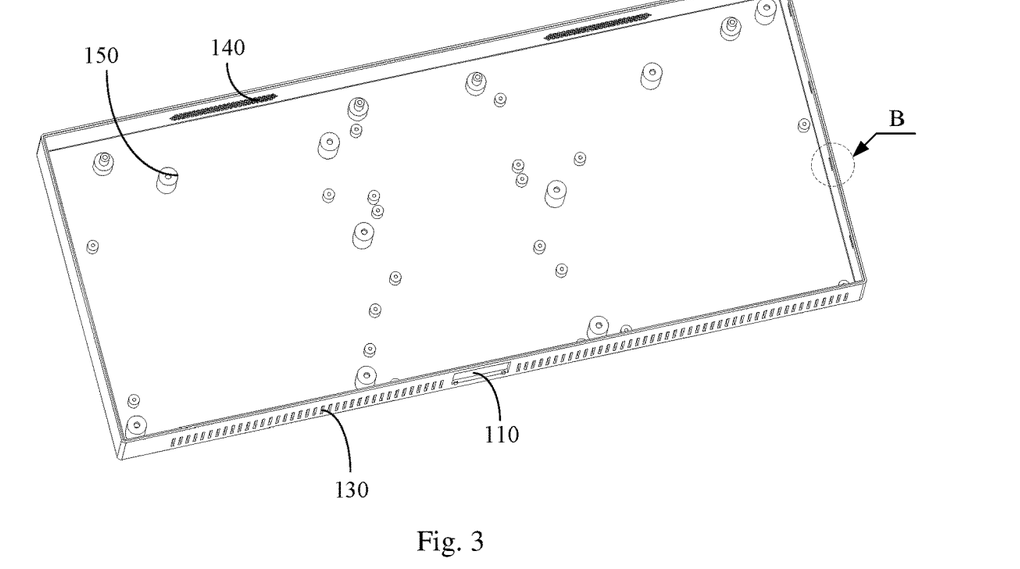
FIG. 3 is a structural view of another view of the box body in the host box of the present application.
Figure 4:
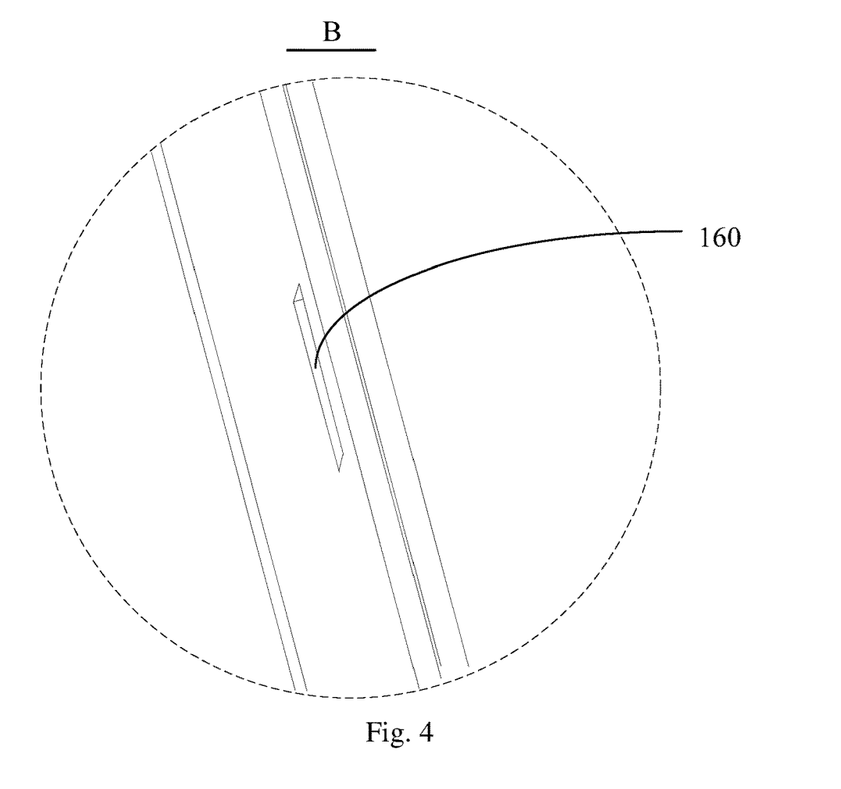
FIG. 4 is an partial enlarged view of B in FIG. 3.
Figure 9:
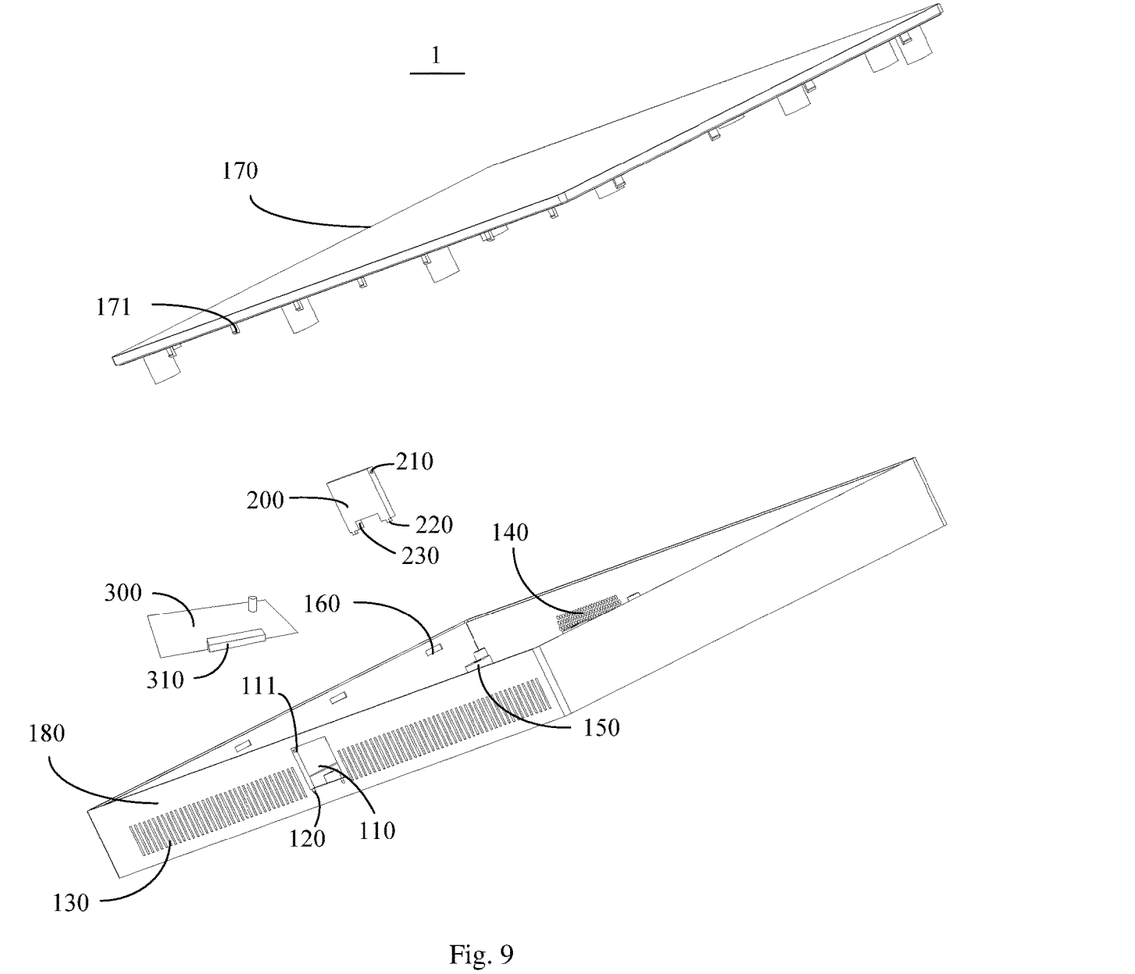
FIG. 9 is a exploded schematic view of the host box of the present application.

In addition, as shown in FIG. 3 or FIG. 9, a horn assembly is further disposed in the host box 1, and a horn hole 140 is further disposed in the box body 10. The horn hole 140 is provided to transmit the sound of the horn in the box body 10 to the outside so that the user can hear the sound of the horn.

Figure 8:
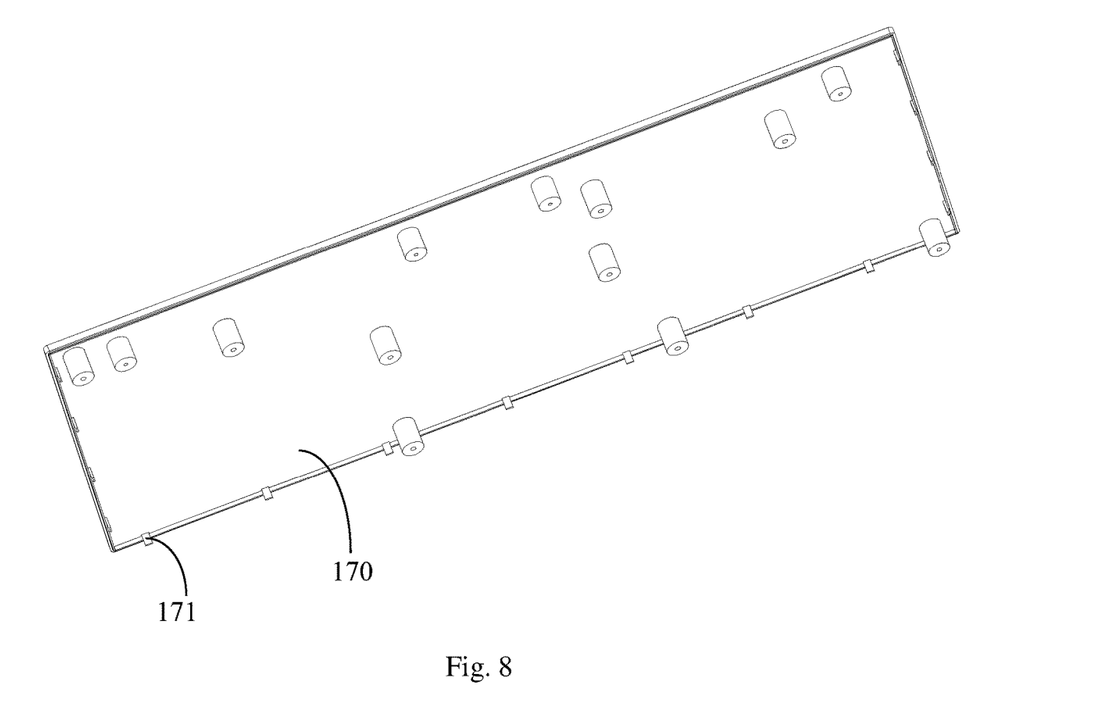
FIG. 8 is a structural view of the upper cover of the host box of the present application.

As shown in FIG. 8 and FIG. 9, in order to facilitate the installation of internal components, the box body 10 of the present embodiment includes an upper cover 170 and a lower casing 180 detachably connected to the upper cover 170. Specifically, a connection manner such as a nap fit or a threaded connection may be adopted between the upper cover 170 and the lower casing 180. When a snap fit is adopted between the upper cover 170 and the lower casing 180, one side of the upper cover 170 toward the lower casing 180 is provided with a buckle 171, and a plurality of buckles 171 are generally disposed, and the plurality of buckles 171 are disposed apart along the circumference of the upper cover 170; the lower casing 180 is correspondingly provided with a buckle hole 160, and the buckle 171 snaps into the buckle hole 160, thereby achieving the snap fit effect of the upper cover 170 and the lower casing 180. It can be understood that when the thickness of the wallboard of the upper cover 170 and the lower casing 180 is small, the snap fit is often used between the upper cover 170 and the lower casing 180. When the upper cover 170 and the lower casing 180 are thicker, the upper cover 170 and the lower casing 180 can be correspondingly provided with a threaded hole, and the screw cooperates with the threaded hole to achieve the threaded connection of the upper cover 170 and the lower casing 180; alternatively, the bottom wall of the lower casing 180 is convexly provided with a screw post, and the upper cover 170 is provided with a connecting hole corresponding to the screw post, and the screw is inserted through the connecting hole to be in screwed connection with the screw post, thereby achieving the screwed connection of the upper cover 170 and the lower casing 180.

It can be understood that a receiving cavity is formed between the upper cover 170 and the lower casing 180 for mounting components, but at the same time, due to the presence of the receiving cavity, the upper cover 170 is easily recessed and deformed toward the receiving cavity. In the present embodiment, the bottom wall of the lower casing 180 is convexly provided with a support post 150, and one end of the support post 150 away from the bottom wall of the lower casing 180 abuts against the upper cover 170. One end of the support post 150 is connected to the bottom wall of the lower casing 180, and the other end abuts against the upper cover 170, so that the connection strength between the upper cover 170 and the lower casing 180 is strengthened, and the upper cover 170 is prevented from being easily deformed by an external force. Without doubt, it can be understood that a support post 150 can also be disposed on the side of the upper cover 170 facing the bottom wall of the lower casing 180. The end of the support post 150 away from the upper cover 170 can abut against the bottom wall of the lower casing 180.

Figure 10:
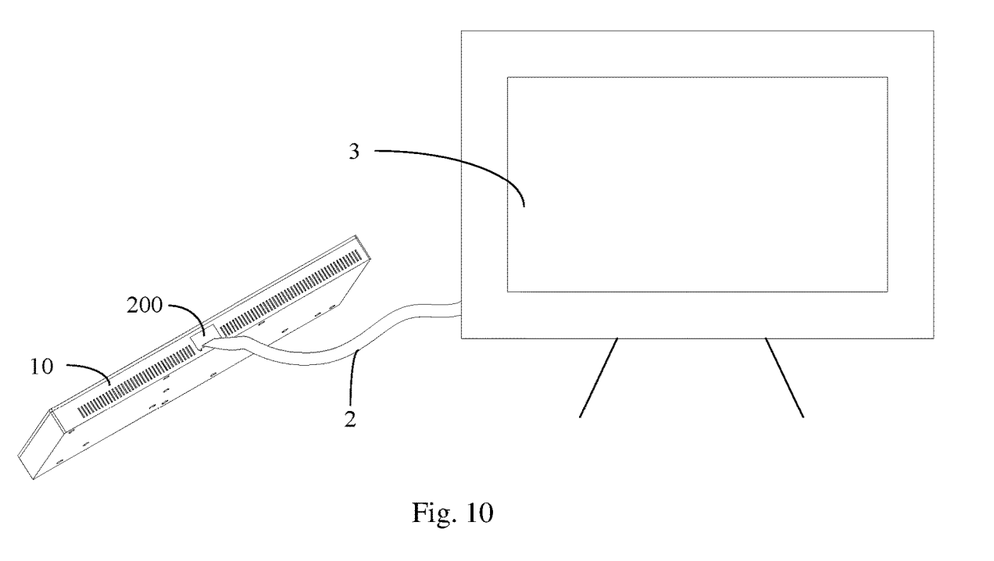
FIG. 10 is a schematic diagram of the connection between the display and the host box in the split-type television of the present application.

The present disclosure further proposes a split-type television, as shown in FIG. 10, the split-type television includes a display 3 and a host box 1. The specific structure of the host box 1 refers to the above embodiments. Since the split-type television adopts all the technical schemes of all the above embodiments, and details are not described herein again Among which the display 3 and the host box 1 have a fission structure, and the display 3 is connected to the host box 1 by the external line 2 to be connected to the external line interface 310.

Specifically, the display 3 and the host box 1 of the split-type television are usually connected by a signal line. It can be understood that the external line interface 310 in the host box 1 described above may include a signal line interface, and the corresponding signal line interface has an aperture 110. The signal line is connected to the signal line interface through the aperture 110, thereby achieving the connection effect between the display 3 and the host box 1.

The embodiments above are merely some embodiments of the present disclosure but are not to be construed as limiting the scope of the present disclosure, and any equivalent structural conversion devised based on the inventive concept of the present disclosure or using the drawing of the present disclosure, or a direct or indirect application of the present disclosure to another related technical field shall fall into the scope of protection of the present disclosure.

What is claimed is:

1. A host box, wherein comprising:
a box body with a circuit board mounted within it, the circuit board includes an external line interface and the box body is provided with an aperture corresponding to the external line interface; and
a cover plate movably mounted at the aperture, and the cover plate can open the aperture so that the external line is directly connected to the external line interface, or the cover plate can close the aperture,
wherein an inner wall of the aperture is provided with at least one connecting post, the cover plate is provided with a pulling portion to cause the cover plate to open toward the outside of the box body, the pulling portion comprises a bump convexly provided at an end of the cover plate away from the connecting post, the box body has a mating groove cooperating with the bump; the size of the mating groove is larger than that of the bump in a direction from the connecting post to the bump.

2. The host box according to claim 1, wherein the inner wall of the aperture is oppositely provided with a pair of connecting posts, and two opposite sides of the cover plate are provided with mounting grooves adapted to the connecting posts, and the connecting posts are inserted into the mounting groove to articulate the cover plate to the box body.

3. The host box according to claim 2, wherein the connecting posts are disposed away from a central axis of the aperture.

4. The host box according to claim 3, wherein an end of the cover plate interference fits with the aperture away from the connecting posts.

5. The host box according to claim 2, wherein the mounting grooves are disposed away from a central axis of the cover plate.

6. The host box according to claim 2, wherein the cover plate is provided with a perforating hole in communication with the aperture, and the external line passes through the perforating hole.

7. The host box according to claim 6, wherein the perforating hole is disposed at an edge of the cover plate.

8. The host box according to claim 7, wherein an end of the cover plate away from the mounting groove is provided with a notch, and the perforating hole includes the notch, and the notch communicates with the aperture.

9. The host box according to claim 8, wherein the aperture is disposed at a side wall of the box body and the notch is disposed at a lower end of the cover plate.

10. The host box according to claim 8, wherein the shape of the notch is rectangular, or trapezoidal, or curved, or V-shaped, or wavy.

11. The host box according to claim 1, wherein a side of the bump facing the inside of the box body is provided with a wedging block groove, and the wedging block groove runs through the bump away from the end face of the connecting post.

12. The host box according to claim 1, wherein the box body has a heat dissipation hole and a horn hole.

13. The host box according to claim 12, wherein a plurality of heat dissipation holes are evenly disposed spaced from each other.

14. The host box according to claim 1, wherein the box body comprises an upper cover and a lower casing detachably connected to the upper cover, and a bottom wall of the upper cover is convexly provided with a support post, the support post abuts against the lower casing away from one end of the bottom wall of the lower casing.

15. The host box according to claim 14, wherein the aperture is disposed on the lower casing.

16. The host box according to claim 14, wherein the upper cover is provided with a buckle toward a side of the lower casing, and the lower casing is correspondingly provided with a buckle hole, and the buckle snaps into the buckle hole to snap fit the upper cover to the lower casing.

17. A host box, wherein comprising:
a box body with a circuit board mounted within it, the circuit board includes an external line interface and the box body is provided with an aperture corresponding to the external line interface; and
a cover plate movably mounted to the aperture, and the cover plate can open the aperture so that the external line is directly connected to the external line interface; or the cover plate can close the aperture and the outer wall surface of the cover plate is flush with that of the box body,
wherein an inner wall of the aperture is provided with at least one connecting post, the cover plate is provided with a pulling portion to cause the cover plate to open toward the outside of the box body, the pulling portion comprises a bump convexly provided at an end of the cover plate away from the connecting post, the box body has a mating groove cooperating with the bump; the size of the mating groove is larger than that of the bump in a direction from the connecting post to the bump.

18. A split-type television, wherein comprising a display and a host box, the host box comprising:
- a box body with a circuit board mounted within it, the circuit board includes an external line interface and the box body is provided with an aperture corresponding to the external line interface; and
- a cover plate movably mounted to the aperture, and the cover plate can open the aperture so that the external line is directly connected to the external line interface, or the cover plate can close the aperture;
- the display is connected to the host box by means of being connected to the external line interface by the external line,
- wherein an inner wall of the aperture is provided with at least one connecting post, the cover plate is provided with a pulling portion to cause the cover plate to open toward the outside of the box body, the pulling portion comprises a bump convexly provided at an end of the cover plate away from the connecting post, the box body has a mating groove cooperating with the bump; the size of the mating groove is larger than that of the bump in a direction from the connecting post to the bump.

\* \* \* \* \*